United States Patent
Dan et al.

(10) Patent No.: US 10,529,646 B2
(45) Date of Patent: Jan. 7, 2020

(54) METHODS OF MANUFACTURING A CERAMIC SUBSTRATE AND CERAMIC SUBSTRATES

(71) Applicant: AMOSENSE CO., LTD., Chungcheongnam-do (KR)

(72) Inventors: Sung-Baek Dan, Hwaseong-si (KR); Jin-Su Hwang, Namyangju-si (KR)

(73) Assignee: AMOSENSE CO., LTD., Chungcheongnam-do (KR)

( * ) Notice: Subject to any disclaimer, the term of this patent is extended or adjusted under 35 U.S.C. 154(b) by 0 days.

(21) Appl. No.: 15/568,780

(22) PCT Filed: Apr. 25, 2016

(86) PCT No.: PCT/KR2016/004305
§ 371 (c)(1),
(2) Date: Oct. 23, 2017

(87) PCT Pub. No.: WO2016/171530
PCT Pub. Date: Oct. 27, 2016

(65) Prior Publication Data
US 2018/0090414 A1    Mar. 29, 2018

(30) Foreign Application Priority Data

Apr. 24, 2015  (KR) .................. 10-2015-0057925
Apr. 24, 2015  (KR) .................. 10-2015-0057926
(Continued)

(51) Int. Cl.
*H05K 3/12*    (2006.01)
*H01L 23/373*  (2006.01)
(Continued)

(52) U.S. Cl.
CPC ............ *H01L 23/3735* (2013.01); *B32B 3/30* (2013.01); *B32B 18/00* (2013.01);
(Continued)

(58) Field of Classification Search
CPC .............................. H05K 3/1208; H05K 3/12
See application file for complete search history.

(56) References Cited

U.S. PATENT DOCUMENTS 5,561,321 A  * 10/1996 Hirano ................. B32B 15/01
                                                        257/700
2005/0175773 A1   8/2005 Tsukaguchi et al.
2011/0079418 A1 *  4/2011 Furuichi ............. H01L 21/4846
                                                        174/257

FOREIGN PATENT DOCUMENTS

EP    2861046 A1    4/2015
JP    H10215053 A   8/1998
(Continued)

OTHER PUBLICATIONS

Office Action in Korean Patent Application No. KR10-2016-0050406 dated Nov. 22, 2017; Translation (10 pages).
(Continued)

*Primary Examiner* — Jeremy C Norris
(74) *Attorney, Agent, or Firm* — TraskBritt

(57) ABSTRACT

A ceramic substrate manufacturing method and a ceramic substrate manufactured thereby, may include a seed layer, a brazing filler layer, and a metal foil that are laminated on a ceramic substrate and that are brazed such that the metal foil is firmly bonded to the ceramic substrate by a brazing joint layer. Such methods and devices may substantially improve the adhesion of the metal foil and the ceramic substrate.

8 Claims, 12 Drawing Sheets

(30) Foreign Application Priority Data

| Apr. 24, 2015 | (KR) | 10-2015-0057927 |
|---|---|---|
| Apr. 24, 2015 | (KR) | 10-2015-0057928 |
| May 6, 2015 | (KR) | 10-2015-0063263 |

(51) Int. Cl.
  *B32B 18/00* (2006.01)
  *B32B 3/30* (2006.01)
  *H01L 21/48* (2006.01)
  *H01L 23/498* (2006.01)

(52) U.S. Cl.
  CPC .... *H01L 21/4807* (2013.01); *H01L 23/49838* (2013.01); *H01L 23/49866* (2013.01); *H01L 21/4846* (2013.01)

(56) References Cited

FOREIGN PATENT DOCUMENTS

| JP | 2000269392 | | 9/2000 |
|---|---|---|---|
| JP | 2005035874 | A | 2/2005 |
| JP | 2006062930 | A | 3/2006 |
| JP | 2006279035 | A | 10/2006 |
| JP | 2011109057 | A | 6/2011 |
| JP | 2013211441 | A | 10/2013 |
| JP | 2014168811 | A | 9/2014 |
| KR | 19880006961 | A | 7/1998 |
| KR | 100373398 | B1 | 2/2003 |
| KR | 20100068593 | | 6/2010 |
| KR | 101295606 | B1 | 8/2013 |
| WO | 2015022748 | A1 | 2/2015 |

OTHER PUBLICATIONS

Office Action in Korean Patent Application No. KR10-2016-0050407 dated Nov. 22, 2017; Translation (9 pages).
Office Action in Korean Patent Application No. KR10-2016-0050410 dated Nov. 22, 2017; Translation (9 pages).
Office Action in Korean Patent Application No. KR10-2016-0050411 dated Nov. 22, 2017; Translation (10 pages).
International Search Report for International Application No. PCT/KR2016004305 dated Aug. 8, 2016, 5 pages with Translation.
Written Opinion of the International Search Authority for International Application No. PCT/KR2016/004305 dated Aug. 8, 2016, 7 pages.

* cited by examiner

METHODS OF MANUFACTURING A CERAMIC SUBSTRATE AND CERAMIC SUBSTRATES

CROSS-REFERENCE TO RELATED APPLICATIONS

This application is a national phase entry under 35 U.S.C. § 371 of International Patent Application PCT/KR2016/004305, filed Apr. 25, 2016, designating the United States of America and published as International Patent Publication WO 2016/171530 A1 on Oct. 27, 2016, which claims the benefit under Article 8 of the Patent Cooperation Treaty to Korean Patent Application Serial Nos. 10-2015-0057925, 10-2015-0057926, 10-2015-0057927 and 10-2015-0057928, all filed Apr. 24, 2015, and Korean Patent Application Serial No. 10-2015-0063263 filed May 6, 2015.

TECHNICAL FIELD

The present disclosure relates generally to a ceramic substrate manufacturing method and a ceramic substrate manufactured thereby and, more particularly, to a ceramic substrate manufacturing method and a ceramic substrate manufactured thereby, wherein the method includes firmly bonding a metal foil to a ceramic base through brazing.

BACKGROUND

As an example of a ceramic base, a DBC ceramic substrate bonding a metal foil, such as a copper foil, thereon to be unified is generally used. The DBC ceramic substrate used in a semiconductor power module is advantageous not only in terms of having higher heat dissipating characteristics than it of a case where a lead is disposed over a conventional heat dissipating device, but also in providing a semiconductor power module with improved reliability, productivity, and consistency because an inspection process for the bonded state of a heat dissipating plate is not needed.

The range of use of a DBC ceramic substrate has gradually expanded to use to as a semiconductor power module for vehicles due to the increase in use of such vehicles.

The DBC ceramic substrate comprises a ceramic base and a copper film and is manufactured by interfacial bonding force through a sintering process at high temperature.

As one example, a DBC ceramic substrate is manufactured by sintering a copper film of formed an alumina ($Al_2O_3$) ceramic base and a CuO oxide film thereon at 1000° C. to 1100° C. and forming an interfacial bonding between the alumina ($Al_2O_3$) ceramic base and the CuO oxide film.

For another example, a DBC ceramic substrate is manufactured by forming an $Al_2O_3$ layer on a surface of an AlN ceramic base through oxidation at high temperature, laminating a copper film on the surface of the AlN ceramic base copper film and sintering at 1000° C. to 1100° C., and then an interfacial bonding between the alumina ($Al_2O_3$) ceramic substrate and the CuO oxide film is formed.

When manufacturing a conventional DBC ceramic substrate, a sintering process at high temperature is needed for an interfacial bonding between the ceramic base and the copper film and also maintaining a reductive atmosphere is needed to prevent oxidation of Cu when sintering at high temperature.

That is, since sintering equipment capable of forming a reductive atmosphere is needed for manufacturing the conventional DBC ceramic substrate, cost for preparing sintering equipment thereby requiring is high.

In addition, since the conventional DBC ceramic substrate is manufactured by sintering at 1000° C. to 1100° C. and forming the interfacial bonding between the ceramic base and the copper film, it costs a lot to heat to a high temperature for sintering and takes a long time to manufacture, thereby productivity becomes low.

In addition, manufacture of the conventional DBC ceramic base is complicated since the CuO oxide film is formed on the copper film or the $Al_2O_3$ layer is formed on the surface of the AlN ceramic base and then sintered for the interfacial bonding.

Additionally, the conventional DBC ceramic substrate has problems with malfunction during use due to an adhesion problem between the copper film and the ceramic base thereby lowering operation reliability, particularly, when used as a semiconductor power module wherein if thermal shock occurs due to heat generation and cooling, the adhesion problem between the copper film and the ceramic base may be exacerbated.

BRIEF SUMMARY

Technical Problem

Accordingly, the present disclosure has been made keeping in mind the above problems occurring in the related art. In some embodiments, an object of the present disclosure is to provide a ceramic substrate manufacturing method and a ceramic substrate manufactured thereby, wherein the method is performed by unifying a metal foil and a ceramic base through brazing thereby increasing an adhesion strength of the metal foil.

In addition, in some embodiments, another object of the present disclosure is to provide a ceramic substrate manufacturing method and a ceramic substrate manufactured thereby, wherein the method includes printing a brazing paste for easily forming a brazing filler layer considering spreadability and uniformity thereof and then brazing, thereby increasing the adhesion strength of a metal foil and improving quality of a brazing joint layer.

Further, in some embodiments, yet another object of the present disclosure is to provide a ceramic substrate manufacturing method and a ceramic substrate manufactured thereby, wherein the method includes forming a brazing filler layer by plating, thereby precisely controlling the thickness of the brazing joint layer to a desired degree.

Technical Solution

In order to accomplish the above objects, a ceramic substrate manufacturing method according to one embodiment of the present disclosure includes preparing a ceramic base and a metal foil, forming a seed layer on the ceramic base, forming a brazing filler layer on the seed layer, and laminating the metal foil on the brazing filler layer and brazing.

Preparing the ceramic base and the metal foil may include a process of modifying a surface of the ceramic base roughly through chemical or physical treatments.

Preparing the metal foil may include cutting or pressing the metal foil to have a shape of a circuit pattern formed thereon.

Forming the brazing filler layer may include laminating a brazing sheet or printing a brazing filler in the form of paste to form the brazing filler layer.

Forming the brazing filler layer may include plating to form a brazing filler plated layer.

Forming the brazing filler layer may include forming the brazing filler plated layer having a thickness greater than 0 and equal to or less than 10 μm.

The brazing filler layer may include a first Ag layer, one selected from the group consisting of an Al layer, an Ni layer, an Sn layer, and an In layer, laminated on the first Ag layer, and a second Ag layer laminated on a Cu layer, or the brazing filler layer may include a first layer selected from the group consisting of an Al layer, an Ni layer, an Sn layer, and an In layer, an Ag layer laminated on the first layer, and a second layer selected from the group consisting of an Al layer, an Ni layer, an Sn layer, and an In layer, laminated on the Ag layer.

Forming the seed layer may include forming a first seed layer on the ceramic base to ensure a strong bonding force with the ceramic base and forming a second seed layer on the first seed layer to ensure a strong bonding force with the brazing filler layer.

Forming the seed layer may include forming the seed layer through physical vapor deposition.

The first seed layer may be deposited with one material selected from the group consisting of Ti, Hf, and Zr, and the second seed layer be deposited with one material selected from the group consisting of Cu, Ag, Al, Ni, Sn, and In.

Forming the seed layer may include forming a single-layered alloy seed layer as the seed layer using an alloy.

Forming the seed layer may include forming a single-layered alloy seed layer on the ceramic base with one alloy selected from the group consisting of TiCu, NiTi, NiNb, CuMo, and TiAg.

The brazing filler layer may be formed to have multiple holes.

A ceramic substrate according to one embodiment of the present disclosure includes a ceramic base, a seed layer formed on the ceramic base, a brazing joint layer formed on the seed layer and a metal foil brazed on the seed layer by the brazing joint layer.

Fine protruding parts may be formed on a surface of the ceramic base.

The seed layer may include a first seed layer having a bonding force with the ceramic base and formed by deposition and a second seed layer having a bonding force with the brazing joint layer and formed by deposition.

The first seed layer may be formed by one selected from the group consisting of Ti, Hf, and Zr, and the second seed layer is formed by one selected from the group consisting of Cu, Ag, Al, Ni, Sn, and In.

The seed layer may be a single-layered alloy seed layer formed of an alloy mixed of at least two metals.

The single-layered alloy seed layer may be formed of one alloy selected from the group consisting of TiCu, NiTi, NiNb, CuMo, and TiAg.

The brazing joint layer may be an alloy layer formed by mixing Ag with at least one selected from the group consisting of Al, Ni, Sn, and In.

The brazing joint layer and the seed layer may be formed corresponding to a shape of a circuit pattern and may partially protrude from a side surface of a pattern of metal foil.

Advantageous Effects

In some embodiments, the present disclosure provides a structure formed to unify the metal foil and the ceramic base through brazing instead of existing sintering processes by an interfacial bonding force, thereby greatly improving an adhesion between the metal foil and the ceramic base.

In some embodiments, the present disclosure reduces manufacturing costs greatly since high temperatures and vacuum sintering equipment are not required in the sintering process.

In some embodiments, the present disclosure provides a structure formed by printing the brazing paste for easily forming the brazing filler layer considering spreadability and uniformity and then brazing, thereby increasing the adhesion strength of the metal foil, improving the quality of the brazing joining process, and simplifying the brazing joining process.

In some embodiments, the present disclosure is capable of precisely controlling the thickness of the brazing joint layer to a desired thickness by forming a brazing filler layer through plating, and is capable of precisely manufacturing the ceramic substrate having a planned thickness, thereby improving the quality of the ceramic substrate and greatly reducing defective portions.

In particular, in some embodiments, the present disclosure provides forming the thickness of the brazing filler equal to or less than 10 μm thereby capable of reducing the thickness of the ceramic substrate, and the present disclosure provides minimizing a gap between the metal foil and the ceramic base thereby capable of maximizing heat dissipation.

In some embodiments, the present disclosure simplifies the etching process after brazing thereby simplifying the entire manufacturing process and improving the productivity.

DETAILED DESCRIPTION

Figure 1:
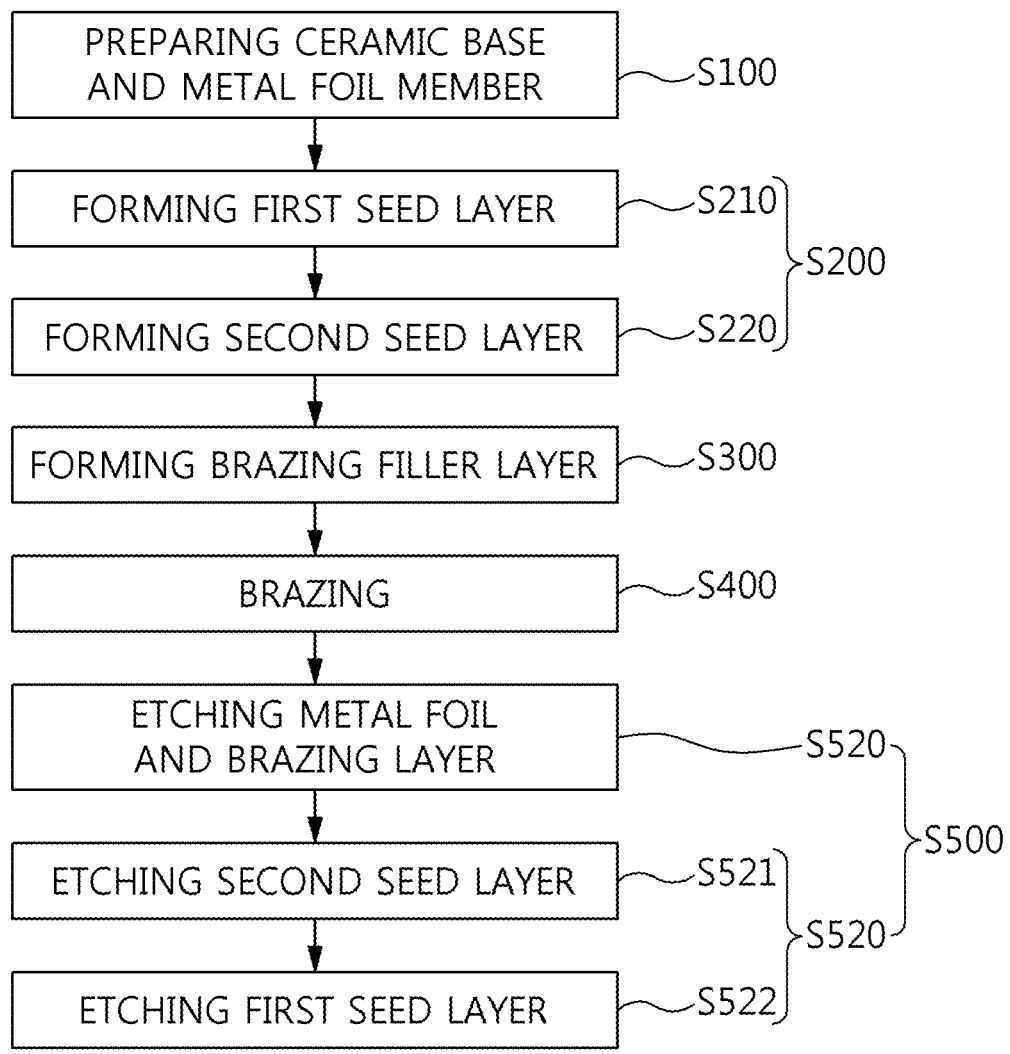
FIG. 1 is a block diagram showing a ceramic substrate manufacturing method of one embodiment according to the present disclosure.

The present disclosure is described in detail below with reference to the accompanying drawings. Repeated descriptions and descriptions of known functions and configurations which have been deemed to obfuscate the gist of the present disclosure will be omitted below. The embodiments of the present disclosure are intended to fully describe the present disclosure to a person having ordinary knowledge in the art to which the present disclosure pertains. Accordingly, the shapes, sizes, etc., of components in the drawings may be exaggerated to make the description clear.

Figure 2:
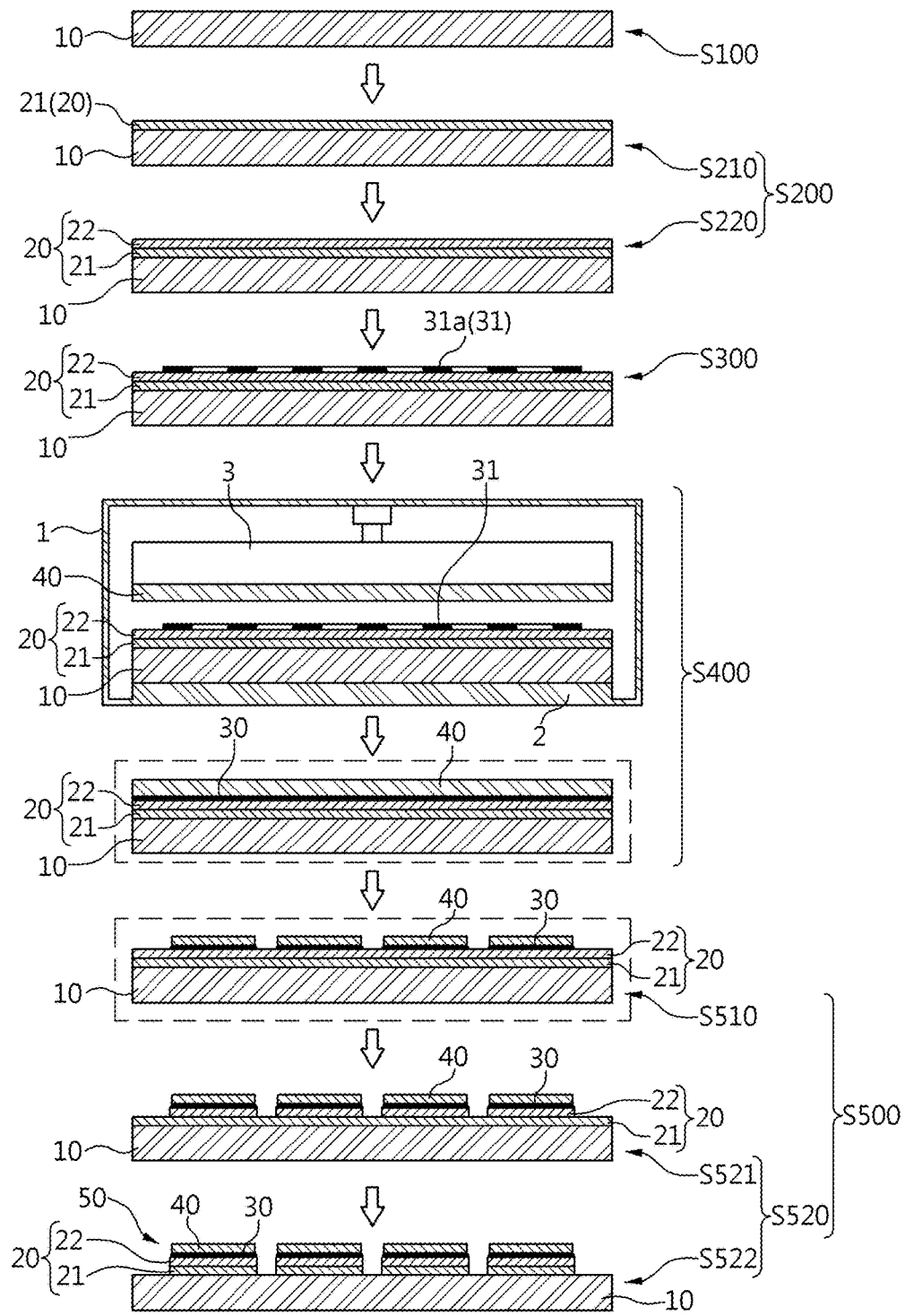
FIG. 2 is a schematic view showing a ceramic substrate manufacturing method of one embodiment according to the present disclosure.

Referring to FIGS. 1 and 2, a ceramic substrate manufacturing method according to one embodiment of the present disclosure includes preparing a ceramic base 10 and a metal foil 40 (S100), forming a seed layer 20 on the ceramic base 10 (S200), forming a brazing filler layer 31 on the seed layer 20 (S300), and laminating the metal foil 40 on the brazing filler layer 31 and brazing (S400).

Preparing the ceramic base 10 and the metal foil 40 (S100) may include a process of modifying a surface of the ceramic base 10 roughly such that the seed layer 20 and the ceramic base 10 are more firmly bonded together.

One example of modifying the surface is forming fine protrusion parts on the surface of the ceramic base 10 by modifying the surface of the ceramic base 10 roughly through chemical treatment using reaction with chemicals or physical treatment through abrasion, sand blasting, etc., in addition, other examples which modify the surface of the ceramic base 10 roughly may be used.

Forming the seed layer 20 (S200) may include:
forming a first seed layer 21 on the ceramic base 10 to ensure a strong bonding force with the ceramic base 10 (S210); and
forming a second seed layer 22 on the first seed layer 21 to ensure a strong bonding force with the brazing filler layer 31 (S220).

Forming the seed layer 20 (S200) is performed through physical vapor deposition to form the seed layer 20, and the physical vapor deposition may be performed of any one selected from the group consisting of vacuum deposition, thermal evaporation, e-beam deposition, laser deposition, sputtering, and arc ion plating.

That is, forming a first seed layer 21 (S210) is performed by depositing a material, such as Ti, Hf, and Zr, as a target material having excellent bonding force with the ceramic base 10 so as to form the first seed layer 21 on the ceramic base 10.

The first seed layer 21 may be deposited with one material selected from the group consisting of Ti, Hf, and Zr. Ti, Hf, and Zr are active metals, thereby having high reactivity with oxygen and nitrogen, and easily forming oxide and nitride.

The ceramic base 10 has nitrogen oxide, for example, Ti. When Ti is deposited, TiO is formed on an interface then a chemical bond with high interfacial bonding force occurs.

In addition, forming the second seed layer 22 (S220) is performed by depositing a material, such as Cu and Ag, as a target material having excellent bonding force with the brazing filler layer 31, such as a Cu-based brazing filler layer 31 and an Ag-based brazing filler layer 31, on the first seed layer 21.

The brazing filler layer 31 may be an alloy brazing sheet of Ag and Cu, or may be a laminated structure brazing sheet laminated on an Ag layer and a Cu layer.

As one example of the laminated structure brazing sheet, the brazing sheet may include a first Ag layer, a Cu layer laminated on the first Ag layer, and a second Ag layer laminated on the Cu layer. Another example of the laminated structure brazing sheet may include a first Cu layer, an Ag layer laminated on the first Cu layer, and a second Cu layer laminated on the Ag layer.

In addition, in the brazing filler layer 31, any one selected from the group consisting of an Al layer, an Ni layer, an Sn layer, and an In layer may be used instead of the Cu layer.

That is, the brazing sheet includes a first Ag layer, one selected from the group consisting of an Al layer, an Ni layer, an Sn layer, and an In layer, laminated on the first Ag layer, and a second Ag layer laminated on the Cu layer. Also, the brazing sheet includes a first layer selected from the group consisting of an Al layer, an Ni layer, an Sn layer, and an In layer, an Ag layer laminated on the first layer, and a second layer selected from the group consisting of an Al layer, an Ni layer, an Sn layer, and an In layer, laminated on the Ag layer.

In this case, forming the second seed layer 22 (S220) may be performed by depositing one material selected from the group consisting of Al, Ni, Sn, and In so as to form the second seed layer 22.

This may be decided depending on the material of the brazing filler layer 31.

By using one selected from the group consisting of an Al layer, an Ni layer, an Sn layer, and an In layer, it is possible to control a process temperature and variously design a brazing filler layer depending on the process temperature.

Forming the brazing filler layer 31 (S300) may be performed by laminating a brazing sheet 31a on the seed layer 20.

In detail, the brazing filler layer 31 may be multiple pieces of the brazing sheet 31a, or may be a brazing sheet having multiple holes to cover a remaining part except holes of the seed layer 20, that is, as one example, multiple empty spaces are defined in the brazing filler layer, the empty spaces being spaced apart from one another.

Because of this, the spreadability of the brazing filler layer 31 is acquired at the brazing step S400, and at the same time, the brazing filler layer 31 melts and spreads uniformly and evenly on an entire contact surface between the seed layer 20 and the metal foil 40.

In addition, when the brazing filler layer 31 melts and is pressurized at the brazing step S400, outflow of the brazing filler layer 31 to sides of the seed layer 20 and the metal foil 40 may be prevented.

The holes of the brazing sheet may be circular or square, and may vary depending on a size and a shape of the ceramic base 10, a type of the brazing sheet, a thickness of a planned brazing joint layer 30, etc.

In addition, forming the brazing filler layer 31 (S300) is performed by printing a brazing paste in the form of paste to form the brazing filler layer 31.

Forming the brazing filler layer 31 (S300) may include printing an Ag paste and forming a first Ag layer, printing a Cu paste on the first Ag layer and forming a Cu layer, and printing an Ag paste on the Cu layer and forming a second Ag layer.

Alternatively, forming the brazing filler layer 31 (S300) may include printing a Cu paste and forming a first Cu layer, printing an Ag paste on the first Cu layer and forming an Ag layer, and printing a Cu paste on the Ag layer and forming a second Cu layer.

In addition, in the brazing paste, any one selected from the group consisting of an Al paste, an Ni paste, an Sn paste, and an In paste may be used instead of the Cu paste.

That is, the brazing filler layer 31 formed by printing a brazing paste and being laminated includes a first Ag layer, one selected from the group consisting of an Al layer, an Ni layer, an Sn layer, and an In layer, laminated on the first Ag layer, and a second Ag layer laminated on a Cu layer. Also, the brazing filler layer 31 includes a first layer selected from the group consisting of an Al layer, an Ni layer, an Sn layer, and an In layer, an Ag layer laminated on the first layer, and a second layer selected from the group consisting of an Al layer, an Ni layer, an Sn layer, and an In layer, laminated on the Ag layer. In this case, forming the second seed layer 22 (S220) may be performed by depositing one material selected from the group consisting of Al, Ni, Sn, and In so as to form the second seed layer 22.

This may be decided depending on material of the brazing paste.

By using one selected from the group consisting of an Al layer, an Ni layer, an Sn layer, and an In layer, it is possible to control a process temperature and variously design a brazing filler layer 31 depending on the process temperature.

The brazing paste is formed of paste including brazing metal powder and solvent, and may further include a binder and the like, and the brazing metal powder may be variously changed to any other metal powder that melts at a temperature equal to or above 450° C.

Forming the brazing filler layer 31 (S300) is performed by screen-printing the brazing paste so as to form multiple holes exposing the seed layer 20 thereby forming the brazing filler layer 31 (S300), and the brazing filler layer 31 may cover a remaining part except holes of the seed layer 20, that is, as one example, multiple empty spaces are defined in the brazing filler layer, the empty spaces being spaced apart from one another.

Because of this, the spreadability of the brazing filler layer 31 is acquired at the brazing step S400, and at the same time, the brazing filler layer 31 melts and spreads uniformly and evenly on an entire surface of a contact surface between the seed layer 20 and the metal foil 40.

In addition, when the brazing filler layer 31 melts and is pressurized at the brazing step S400, outflow of the brazing filler layer 31 to sides of the seed layer 20 and the metal foil 40 may be prevented.

That is, forming the brazing filler layer 31 (S300) is performed to print brazing paste so as to form a brazing filler layer having multiple holes to expose the seed layer 20, thereby making it easy to form the brazing filler layer in a desired shape, that is, easy to form while considering optimum spreadability and uniformity.

In addition, forming the brazing filler layer 31 (S300) may be performed by plating a brazing filler layer on the seed layer 20.

Forming the brazing filler layer 31 (S300) may include forming a first Ag layer by plating Ag, forming a Cu layer on the first Ag layer by plating Cu, and forming a second Ag layer by plating Ag.

Alternatively, forming the brazing filler layer 31 (S300) may include forming a first Cu layer by plating Cu, forming an Ag layer on the first Cu layer by plating Ag, and forming a second Cu layer on the Ag layer by plating Cu.

In addition, at forming the brazing filler layer 31 (S300), any one selected from the group consisting of Al, Ni, Sn, and In may be used instead of the Cu.

That is, the brazing filler layer 31 formed by plating includes a first Ag layer, one selected from the group consisting of an Al layer, an Ni layer, an Sn layer, and an In layer, laminated on the first Ag layer, and a second Ag layer laminated on the Cu layer. Also, the brazing filler layer 31 includes a first layer selected from the group consisting of an Al layer, an Ni layer, an Sn layer, and an In layer, an Ag layer laminated on the first layer, and a second layer selected from the group consisting of an Al layer, an Ni layer, an Sn layer, and an In layer, laminated on the Ag layer. In this case, forming the second seed layer 22 (S220) may be performed by depositing one material selected from the group consisting of Al, Ni, Sn, and In so as to form the second seed layer 22.

This may be decided depending on material of the brazing paste.

By using one selected from the group consisting of an Al layer, an Ni layer, an Sn layer, and an In layer, it makes available controlling process temperature and variously designing a brazing filler layer 31 depending on the process temperature.

Forming the brazing filler layer 31 (S300) may form the brazing filler layer 31 to a desired thickness by plating.

Forming the brazing filler layer 31 (S300) may form the brazing filler layer 31 having a thickness greater than 0 and equal to or less than 10 µm.

That is, forming the brazing filler layer 31 (S300) forms a thin brazing filler layer 31 having a thickness equal to or less than 10 µm, and the thickness is not possible by using a brazing sheet or printing a brazing filler paste.

The brazing filler layer 31 is formed to have a thickness greater than 0 and equal to or less than 10 µm so as to minimize a thickness of the brazing layer 30 disposed between the metal foil 40 the ceramic base 10 after brazing process, thereby reducing an entire thickness of a ceramic substrate and smoothly transferring heat generated at the circuit pattern formed with the metal foil 40 to the ceramic base 10 and removing heat.

Forming the brazing filler layer 31 (S300) may be performed through insulation masking to have multiple holes exposing the seed layer 20. As one example, the brazing filler layer 31 may be formed to cover a remaining part except the holes of the seed layer 20, that is, multiple empty spaces are defined in the brazing filler layer, the empty spaces being spaced apart from one another.

Because of this, the spreadability of the brazing filler layer 31 is ensured at the brazing step S400, and at the same time, the brazing filler layer 31 melts and spreads uniformly and evenly on an entire surface of a contact surface between the seed layer 20 and the metal foil 40.

In addition, when the brazing filler layer 31 melts and is pressurized at the brazing step S400, outflow of the brazing filler layer 31 to sides of the seed layer 20 and the metal foil 40 may be prevented.

The holes of the brazing filler layer 31 may be circular or square, and may vary depending on a size and a shape of the ceramic base 10, a type of the brazing filler layer 31, a thickness of a planned brazing joint layer 30, etc.

On the other hand, the brazing step S400 brazes the brazing filler layer 31 and the metal foil 40, which are laminated on the ceramic base 10. That is, after the brazing filler layer 31 is interposed between the metal foil 40 and the second seed layer 22, the brazing step S400 brazes the metal foil 40 on the second seed layer 22 through the brazing layer 30 formed by melting the brazing filler layer 31.

As one example, the brazing step S400 pressurizes the brazing filler layer 31 interposed between the metal foil 40 and the ceramic base 10 while heating the brazing filler layer 31 at 800° C. to 900° C. in a brazing furnace 1.

In detail, the brazing furnace 1 includes a lower pressing jig portion 2 on which the ceramic base 10 is placed and an upper pressing jig portion 3 above the lower pressing jig portion 2 and being apart from the metal foil 40, and the brazing furnace 1 moves at least one of the lower pressing jig portion 2 and the upper pressing jig portion 3 up or down and pressurizes the brazing filler layer 31 interposed between the metal foil 40 and the ceramic base 10 while heating the brazing filler layer 31.

The brazing filler layer 31 is heated, melts, and is pressurized between the lower pressing jig portion 2 and the upper pressing jig portion 3 in the brazing furnace 1, therefore, the brazing filler layer 31 spreads evenly and uniformly between the second seed layer 22 and the metal foil 40 and is formed to be the brazing joint layer 30 brazing the metal foil 40.

In addition, the brazing step S400 includes a process of withdrawing the ceramic base 10 from the brazing furnace 1 and cooling the ceramic base 10, finally the metal foil 40 is brazed to the ceramic base 10 through cooling process.

The brazing filler layer 31 may partly protrude from a side surface of the metal foil 40 at the brazing step S400. This enlarges a contact surface of the brazing filler such that the metal foil 40 is firmly bonded.

The brazing step S400 is performed by laminating the metal foil 40 on the brazing filler layer 31 and brazing the metal foil 40 and the seed layer 20 with the interposition of the brazing joint layer 30 formed by heating the brazing filler layer 31 in the brazing furnace 1 and melting the brazing filler layer 31.

As one example, the brazing step S400 pressurizes the brazing filler layer 31 interposed between the metal foil 40 and the ceramic base 10 while heating the brazing filler layer 31 at 800° C. to 900° C. in a brazing furnace 1.

In detail, the brazing furnace 1 includes a lower pressing jig portion 2 on which the ceramic base 10 is placed and an upper pressing jig portion 3 above the lower pressing jig portion 2 and being apart from the metal foil 40, and the brazing furnace 1 moves at least one of the lower pressing jig portion 2 and the upper pressing jig portion 3 up or down and pressurizes the brazing filler layer 31 interposed between the metal foil 40 and the ceramic base 10 while heating the brazing filler layer 31.

Since the brazing filler layer 31 is heated in the brazing furnace 1, melts, and has multiple empty spaces, when the brazing filler layer 31 is pressurized between the lower pressing jig portion 2 and the upper pressing jig portion 3, outflow of the brazing filler layer 31 to an outer periphery of the ceramic base 10 and the metal foil 40 is prevented and the brazing filler layer 31 spreads evenly and uniformly on entire surfaces of the seed layer 20 and the metal foil 40 thereby the metal foil 40, may be firmly bonded on the second seed layer 22.

In addition, the brazing step S400 includes a process of withdrawing the ceramic base 10 from the brazing furnace 1 and cooling the ceramic base 10, whereafter the metal foil 40 is brazed to the ceramic base 10 through a cooling process.

One embodiment according to the ceramic substrate manufacturing method of the present disclosure may further include etching step S500 etching the metal foil 40, the brazing joint layer 30, and the seed layer 20 and forming a circuit pattern 50.

The etching step S500 may include etching the metal foil 40 and the brazing joint layer 30 by etching the metal foil 40 and the brazing joint layer 30 at once with one type of etching solution (S510) and etching the seed layer by etching the seed layer 20 (S520).

Etching the metal foil 40 and the brazing joint layer 30 (S510) is performed by one etching process with the one type of the etching solution, etches the metal foil 40 and the brazing joint layer 30 corresponding to a shape of the circuit pattern 50, and also etches the brazing joint layer 30 to be partially protruded from a side surface of the metal foil.

Etching the brazing joint layer 30 to protrude from the side surface of the metal foil 40 is for improving adhesion of the metal foil 40 to the ceramic base 10.

Etching the seed layer (S520) includes etching the seed layer 20 using the etched brazing joint layer 30 as a barrier and is divided into etching the second seed layer 22 (S521) and etching the first seed layer 21 (S522).

Figure 3:
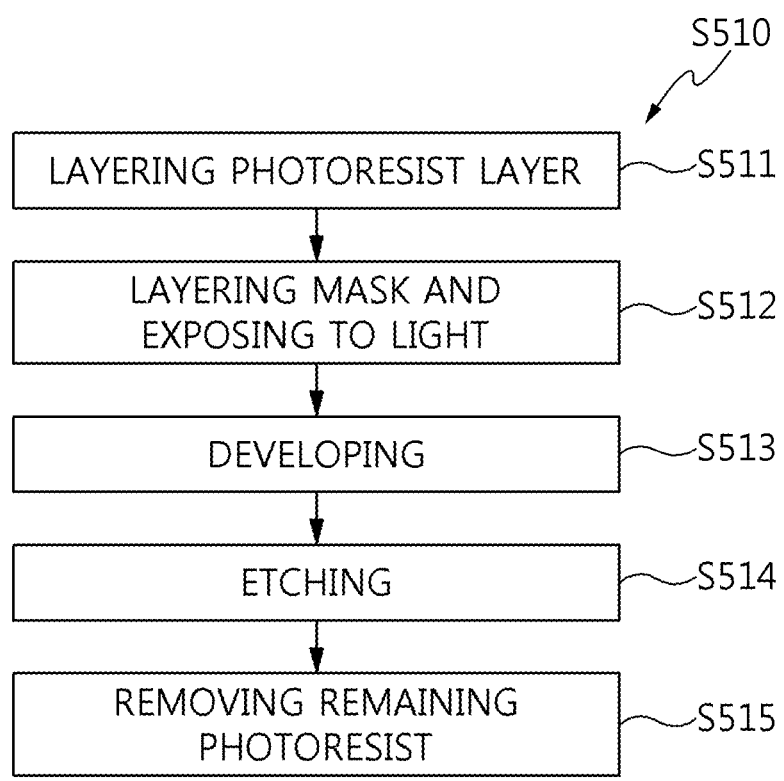
FIG. 3 is a block diagram showing a metal foil etching process and a brazing joint layer etching process in a ceramic substrate manufacturing method of one embodiment according to the present disclosure.
Figure 4:
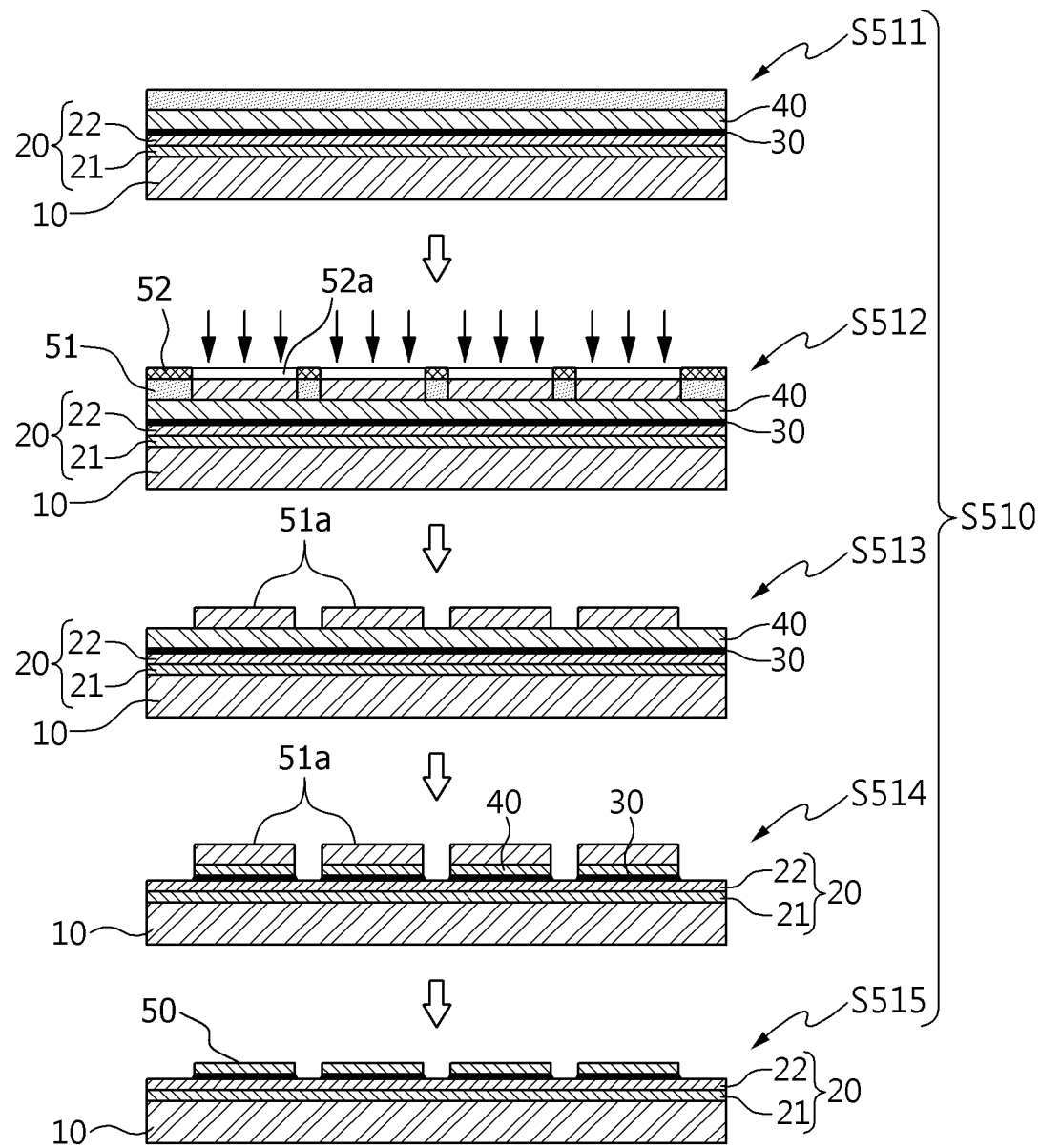
FIG. 4 is a schematic view showing a metal foil etching process and a brazing etching process in a ceramic substrate manufacturing method of one embodiment according to the present disclosure.

Etching the metal foil 40 and the brazing joint layer 30 (S510) includes accurately etching the metal foil 40 and the brazing joint layer 30 at the same time using an etching solution for metal foil after masking the metal foil 40 corresponding to the shape of the circuit pattern 50, which will be described in detail hereinbelow referring to FIGS. 3 and 4.

Etching the metal foil and brazing joint layer (S510) includes layering a photoresist layer 51 on the metal foil 40 (S511), layering a mask 52 formed to have a pattern hole 52a corresponding to the circuit pattern 50, on the photoresist layer 51 and exposing to light (S512), leaving a part that was exposed to light and hardened after removing the mask 52, and then removing a remaining photoresist layer 51 (S513), etching by using a photoresist layer 51a, remaining on the metal foil 40, as a barrier (S514), and removing the photoresist layer 51a remaining on the metal foil 40 after the etching S514 (S515).

Figure 5:
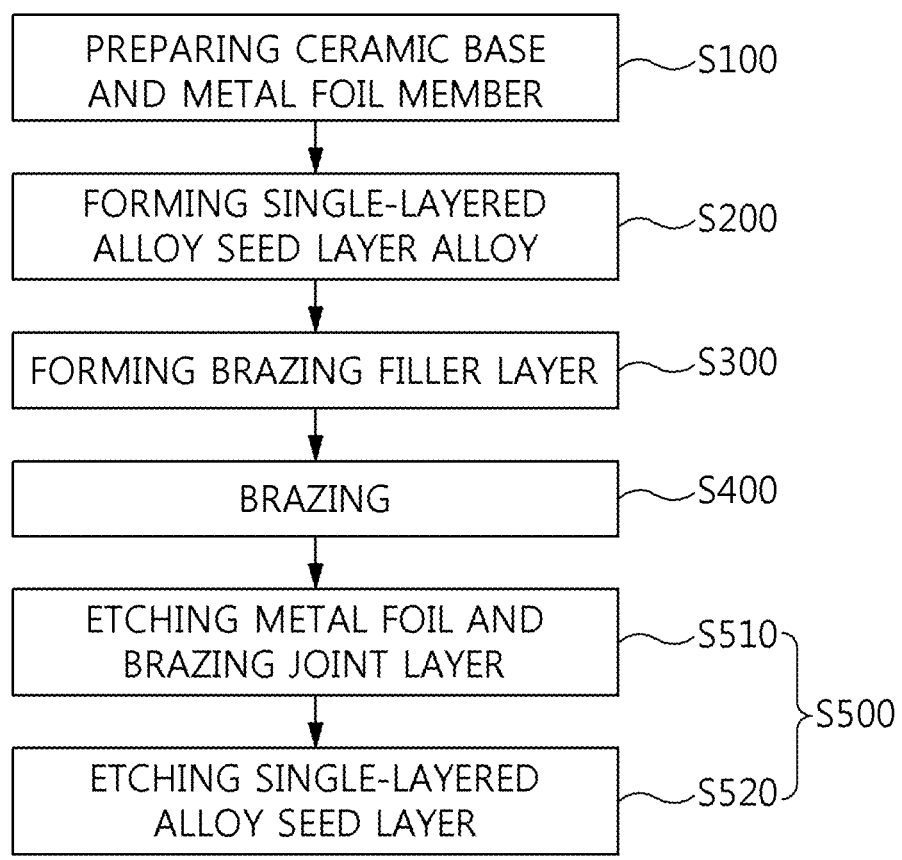
FIG. 5 is a block diagram showing a ceramic substrate manufacturing method of another embodiment according to the present disclosure.
Figure 6:
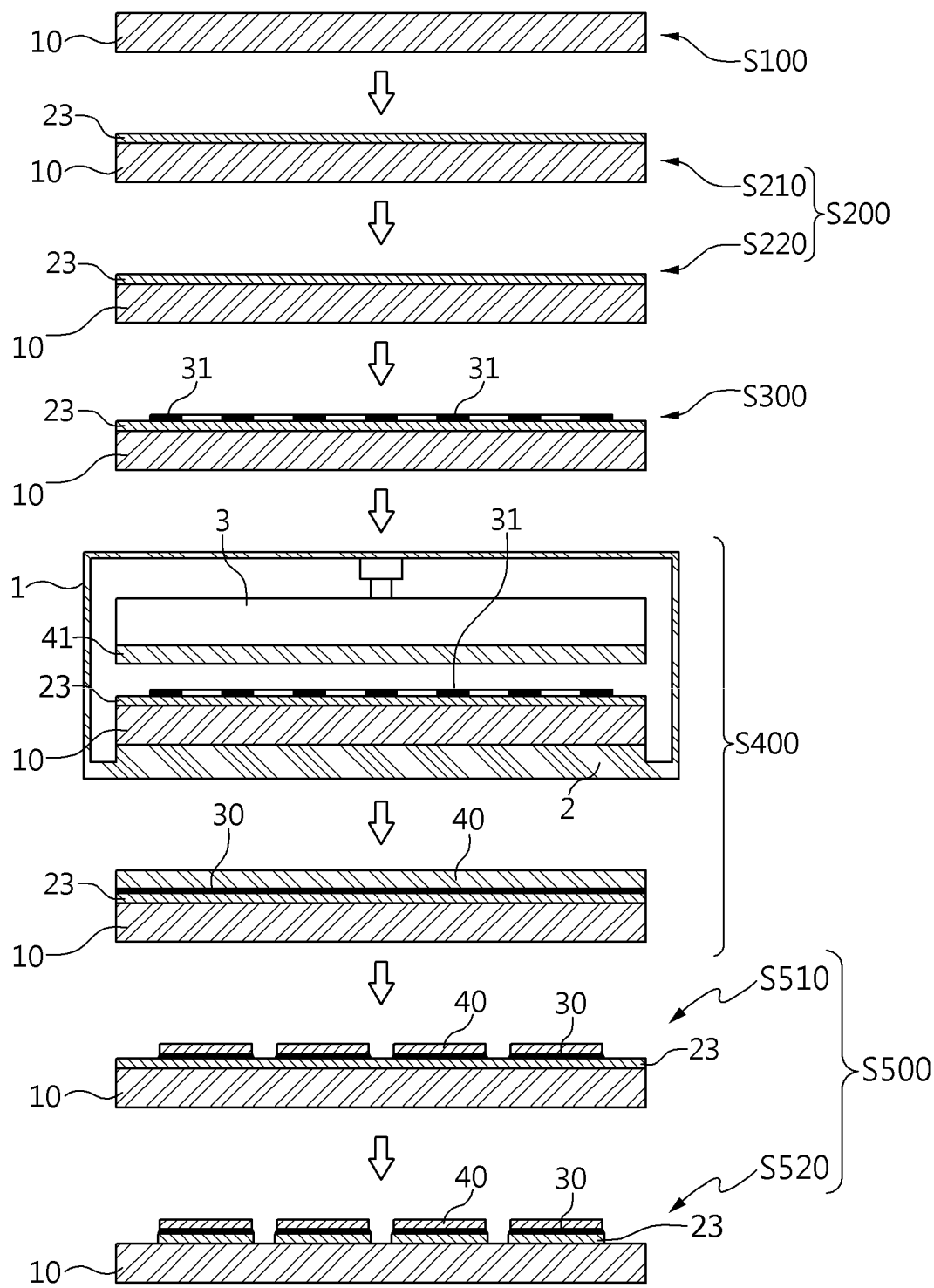
FIG. 6 is a schematic view showing a ceramic substrate manufacturing method of another embodiment according to the present disclosure.

Meanwhile, FIG. 5 is a block diagram showing a ceramic substrate manufacturing method of another embodiment according to the present disclosure and FIG. 6 is a schematic view showing a ceramic substrate manufacturing method of another embodiment according to the present disclosure.

Referring to FIGS. 5 and 6, as one example, the ceramic substrate manufacturing method of another embodiment according to the present disclosure is performed by forming a single-layered alloy seed layer 23 as the seed layer 20, using an alloy at the forming step S200 of the seed layer 20.

More specifically, as one example, forming the seed layer 20 may be performed by forming the single-layered alloy seed layer 23 on the ceramic base 10 with one alloy selected from the group consisting of TiCu, NiTi, NiNb, CuMo, and TiAg.

The TiCu, NiTi, NiNb, CuMo, and TiAg act as active metals and are manufactured for an alloy ratio capable of performing one etching process with one etching solution.

Forming the seed layer 20 (S200) includes forming the single-layered alloy seed layer 23, but also is capable of satisfying an adhesion with the ceramic base 10 and adhesion with the brazing joint layer 30 thereby simplifying the seed layer forming process.

In addition, since forming the seed layer is capable of etching the single-layered alloy seed layer 23 by one etching process, the number of processes of the etching step S500 is reduced.

Figure 7:
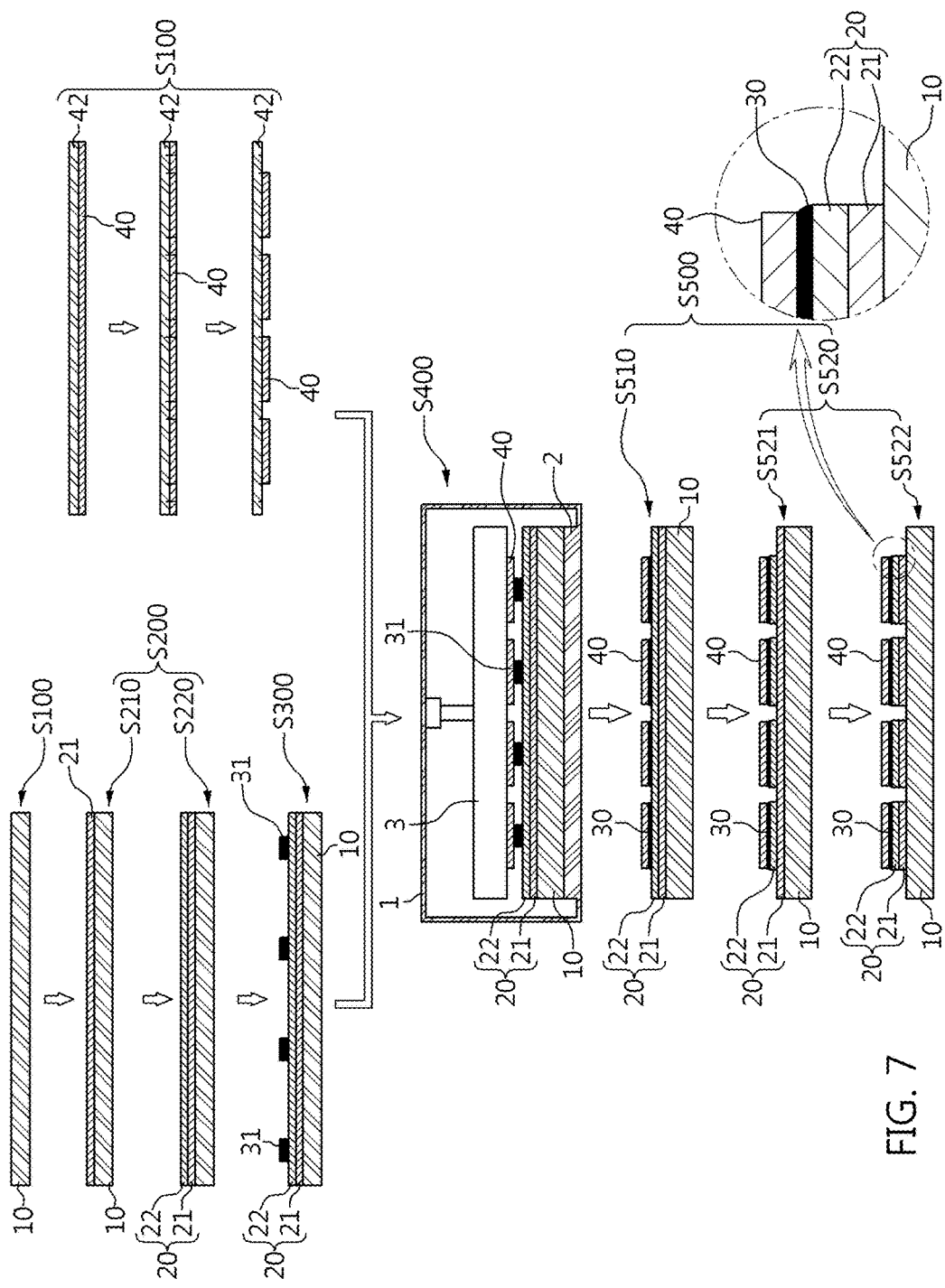
FIGS. 7 and 8 are schematic views showing a ceramic substrate manufacturing method of yet another embodiment according to the present disclosure.
Figure 8:
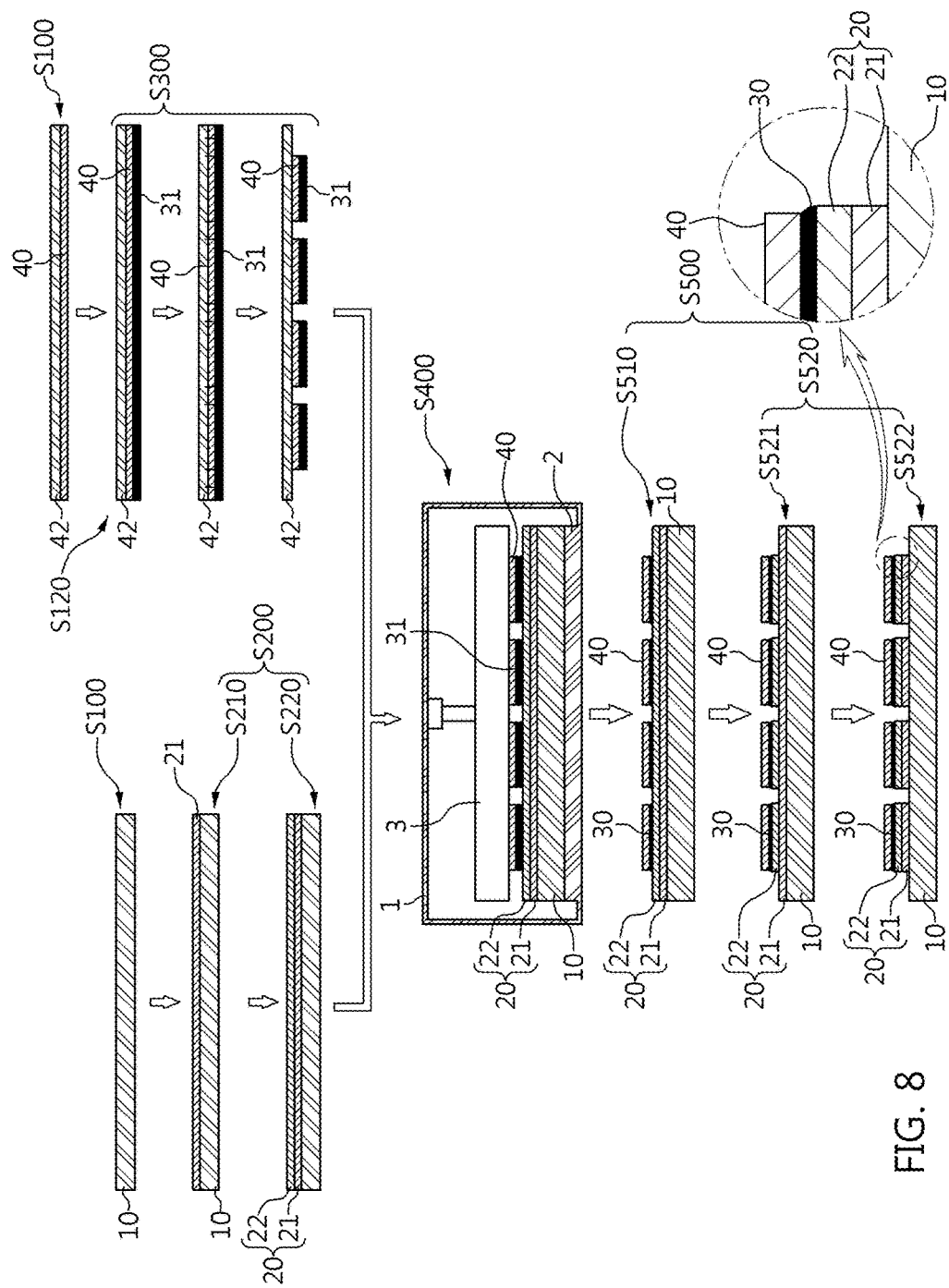

Meanwhile, referring to FIGS. 7 and 8, as one example, the ceramic substrate manufacturing method of another embodiment according to the present disclosure is performed by preparing a metal foil 40 formed to be a shape of a circuit pattern.

The metal foil 40 with the shape of the circuit pattern may be formed by cutting with a laser or a cutter, and by pressing.

The metal foil 40 is bonded to a support sheet 42, and the metal foil 40 is cut or pressed at preparing step S100 only while the support sheet 42 is cut or pressed in a range of half-cutting such that the support sheet 42 is not completely cut and maintains a shape thereof.

Therefore, a remaining part, except the metal foil 40, corresponding to the circuit pattern is easily removed, such that the metal foil 40 is easily and accurately disposed on the ceramic base 10 while the metal foil 40, corresponding to the circuit pattern only remains on the support sheet 42.

Referring to FIG. 8, the brazing filler layer 31 may be formed on the metal foil 40.

The brazing filler layer 31 may partly protrude from a side surface of the metal foil 40 at the brazing step S400. This enlarges the contact surface of the brazing filler such that the metal foil 40 is more firmly bonded.

In addition, an etching step S500 may etch the brazing joint layer 30 and the seed layer 20 using the metal foil 40 as a barrier and remove a remaining part except the part corresponding to the circuit pattern without the etching step S510 of the metal foil 40 and the brazing joint layer 30.

In addition, the etching step S520 includes etching the seed layer 20 using the brazing joint layer 30 as a barrier, protruding from the side of the metal foil 40, and removing the seed layer 20.

The etching step S520 of etching the seed layer 20 and using the brazing joint layer 30 as a barrier protruding from the side of the metal foil 40 is divided into an etching step S521 of the second seed layer 22 and an etching step S522 of the first seed layer 21, furthermore, the etching step S500 includes etching the seed layer 20, using the brazing joint layer 30 as the barrier and partially exposing the brazing joint layer 30 and the seed layer 20 to the side surface of the metal foil 40.

Figure 9:
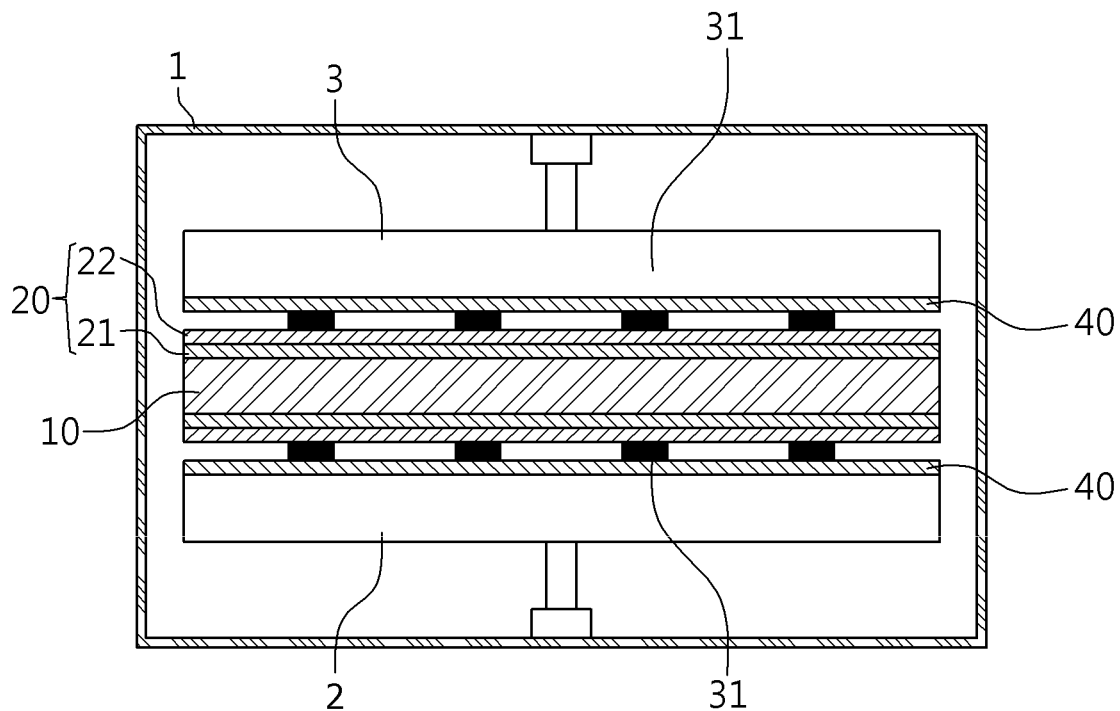
FIG. 9 is a schematic view showing a ceramic substrate manufacturing method of yet another embodiment according to the present disclosure.

Meanwhile, referring to FIG. 9, the ceramic substrate manufacturing method of another embodiment according to the present disclosure provides laminating the metal foils 40 to each of the upper and lower surfaces of the ceramic base 10 and braze. In this case, the seed layers 20 are respectively formed on the both surfaces of the ceramic base 10 in the forming step S200 of the seed layers 20 and the brazing filler layers 31 are respectively laminated on the seed layers 20 formed on the both surfaces of the ceramic base 10.

In addition, in the brazing step S400, the metal foils 40 are respectively laminated on the brazing filler layers 31 at the both surfaces of the ceramic base 10, and then the ceramic base 10 is disposed between the lower pressing jig portion 2 and the upper pressing jig portion 3 of the brazing furnace 1, and finally, the metal foil 40 is pressurized at the both surfaces of the ceramic base 10 while heated.

Forming the seed layer 20 by laminating and brazing the metal foil 40 on the ceramic base 10 (S200), laminating the brazing filler layer 31 (S300), and the brazing step S400 are repeated in the same manner as with the described embodiment except for disposing the seed layers 20, the brazing filler layers 31, and the metal foils 40 on the both surfaces of the ceramic base 10, therefore omitted.

Figure 10:
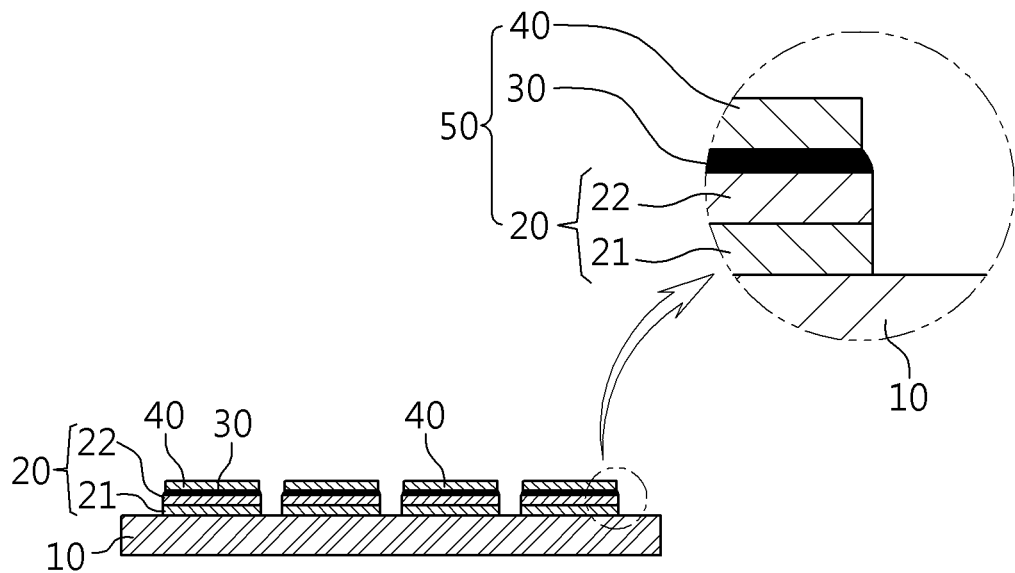
FIG. 10 is a cross-sectional view showing a ceramic substrate of one embodiment according to the present disclosure.

Meanwhile, referring to FIG. 10, a ceramic substrate according to one embodiment of the present disclosure includes a ceramic base 10.

As one example, the ceramic base 10 may be one selected from the group consisting of an alumina ($Al_2O_3$) ceramic substrate, an AlN ceramic substrate, an SiN ceramic substrate, and an $Si_3N_4$ ceramic substrate; furthermore, it is possible to perform with a ceramic material used for a semiconductor power module, etc.

Fine protruding parts may be formed on a surface of the ceramic base 10. The fine protruding parts enhance the adhesion with the brazing joint layer 30.

The seed layer is disposed on the ceramic base 10, and a metal foil 40 is brazed on the seed layer 20 through a brazing joint layer 30. The brazing joint layer 30 is formed after a brazing filler layer 31 melts and solidifies, such that the metal foil 40 is bonded on the ceramic base 10 by the brazing filler layer 31.

In addition, the seed layer 20 is firmly bonded with the metal foil 40 by the brazing joint layer 30.

The seed layer 20 includes a first seed layer 21 formed of a material having excellent bonding force with the ceramic base 10 and a second seed layer 22 formed of a material having excellent bonding force with the brazing joint layer 30.

That is, as one example, the first seed layer 21 is formed by one selected from the group consisting of Ti, Hf, and Zr, which have excellent bonding force with the ceramic base 10 and thereby acquiring bonding force with the ceramic base 10 as a deposition layer, and the second seed layer 22 is a deposition layer formed by Cu or Ag, which have excellent bonding forces with the brazing joint layer 30.

As one example, the brazing joint layer 30 may be formed of mixed Ag and Cu, and may include 65 wt % to 75 wt % of Ag and 35 wt % to 25 wt % of Cu. Such compositions of the brazing filler layer 31 are easy to be controlled by a brazing temperature in reductive atmosphere or in a vacuum brazing furnace 1, thereby controlling the heating temperature of the brazing furnace 1 to around 860° C. and performing an efficient brazing process.

In addition, as one example, the brazing joint layer 30 is an alloy layer formed by mixing Ag with at least one selected from the group consisting of Al, Ni, Sn, and In.

The brazing joint layer 30 is firmly bonded with the second seed layer 22, and consequently, firmly bonds the metal foil 40 to the ceramic base 10.

As one example, the metal foil 40 may be an aluminum foil or a copper foil.

The metal foil 40 is etched to be a shape of a circuit pattern 50 and is formed to be the circuit pattern 50, and then through an etching step S500 to form the circuit pattern 50, the metal foil 40, the brazing joint layer 30 and the seed layer 20 except the shape of the circuit pattern 50 are removed from the ceramic base 10.

Figure 11:
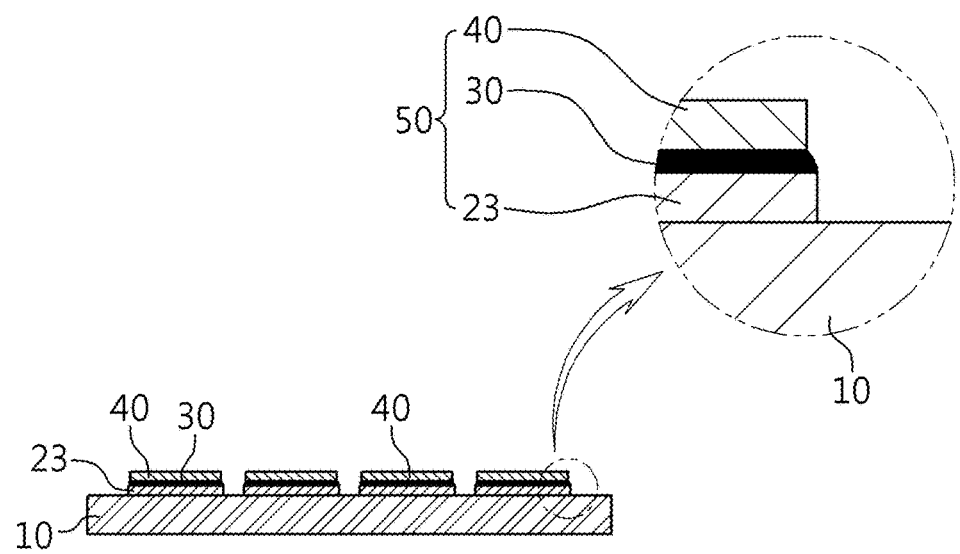
FIG. 11 is a cross-sectional view showing a ceramic substrate of another embodiment according to the present disclosure.

Referring to FIG. 11, the seed layer 20 may be a single-layered alloy seed layer formed of an alloy mixed from at least two metals.

The single-layered alloy seed layer may be formed of one alloy selected from the group consisting of TiCu, NiTi, NiNb, CuMo, and TiAg.

The TiCu, NiTi, NiNb, CuMo, and TiAg act as active metals and are manufactured for an alloy ratio capable of performing one etching process with one etching solution.

Since the seed layer 20 is formed to be the single-layered alloy seed layer 23, it enables simplification of the manufacturing process, reduction of manufacturing cost, and improvement of productivity.

Meanwhile, the seed layer 20, the brazing joint layer 30, and the metal foil 40 may be formed to be the circuit pattern 50 as one example.

That is, the circuit pattern 50 is disposed on the ceramic base 10, and brazed on the seed layer 20 through the seed layer 20 formed on the ceramic base 10, the brazing joint layer 30 formed on the seed layer 20, and the brazing joint layer 30 itself, and also, the circuit pattern 50 includes the metal foil 40 formed to be the shape of the circuit pattern 50.

In addition, the brazing joint layer 30 and the seed layer 20 partly protrude from a side surface of the metal foil 40.

When the brazing joint layer 30 and the seed layer 20 partially protrude from the side surface of the metal foil 40, an adhesion of the metal foil 40 may be enhanced.

Figure 12:
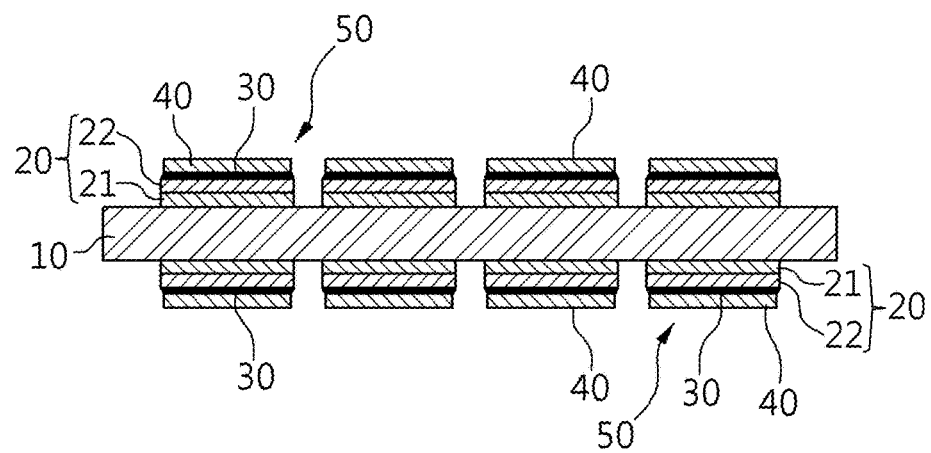
FIGS. 12 and 13 are cross-sectional views showing a ceramic substrate of yet another embodiment according to the present disclosure.
Figure 13:
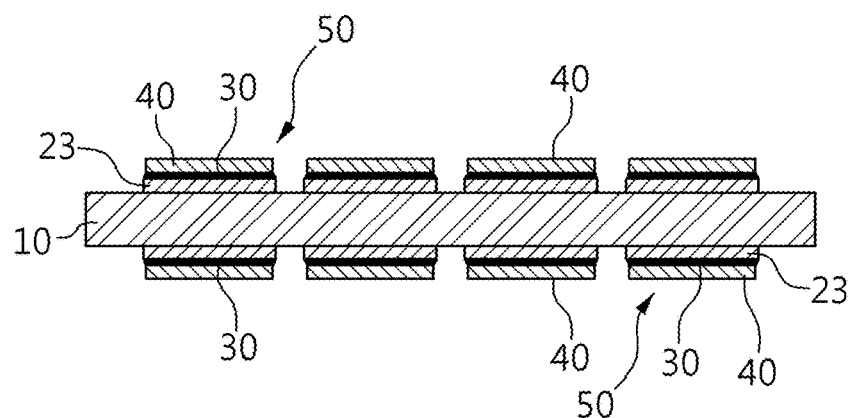

Referring to FIGS. 12 and 13, the ceramic substrate according to another embodiment of the present disclosure may be formed by brazing the metal foil 40 formed of the shape of the circuit pattern 50 on the upper and lower surfaces of the ceramic base 10 through the brazing joint layer 30.

In this case, the fine protruding parts are formed on both surfaces of the ceramic base 10 and then the seed layers 20 are formed, respectively.

Figure 14:
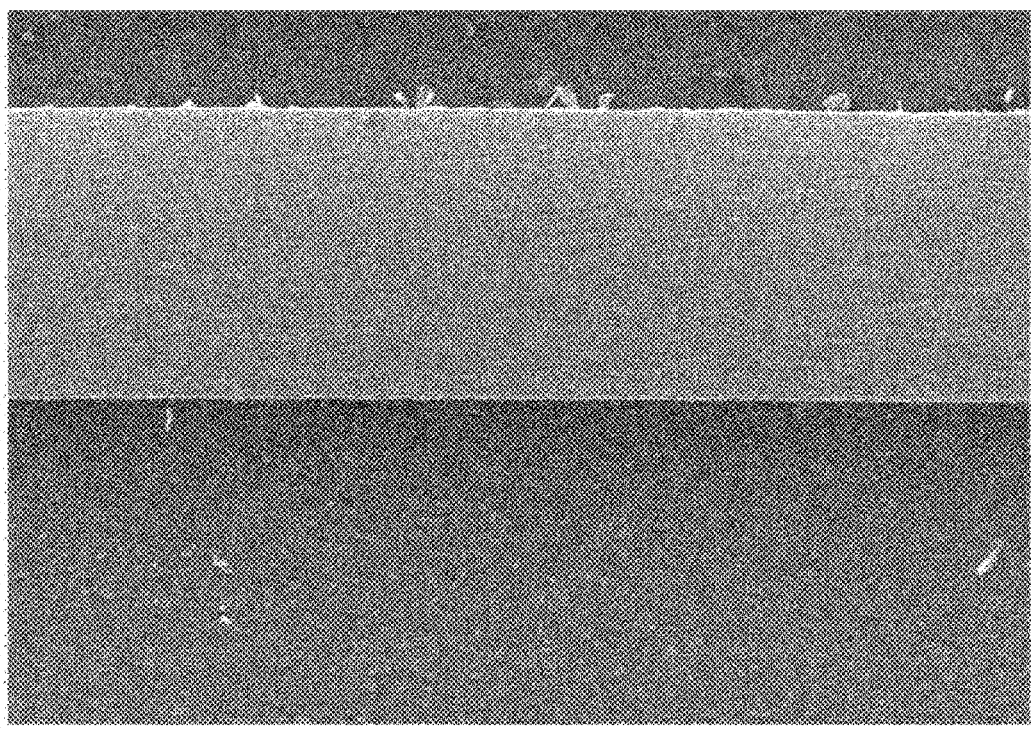
FIGS. 14 and 15 are enlarged images of a ceramic substrate taken by a scanning electron microscope according to the present disclosure.

Meanwhile, FIG. 14 is an enlarged image of the ceramic substrate taken by a scanning electron microscope according to the present disclosure. Also, FIG. 15 is a further enlarged image of the ceramic substrate taken by the scanning electron microscope according to the present disclosure.

Figure 15:
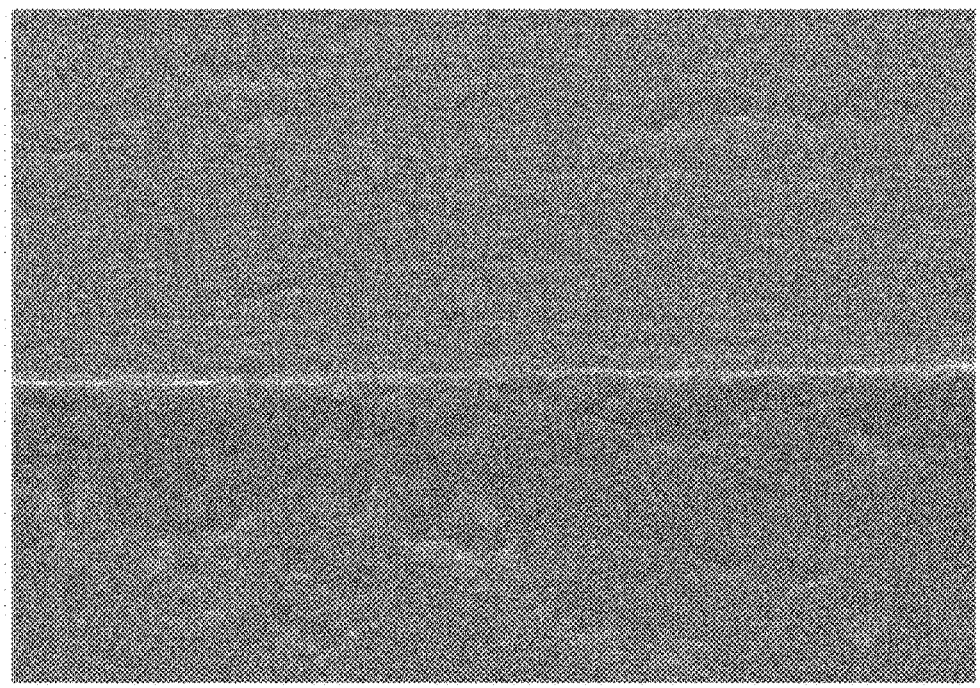

The ceramic substrate of FIGS. 14 and 15 is an example that a copper foil having a thickness of 300 μm is brazed through the brazing step S400, using a brazing sheet including 72 wt % of Ag and 28 wt % of Cu after forming a Ti seed layer and a Cu seed layer on the ceramic base 10.

When repeating joint strength tests 200 times to the ceramic substrate of the FIGS. 14 and 15 at room temperature without thermal shock, a minimum was 5.41 kgf/cm, a maximum was 7.41 kgf/cm and an average was 6.34 kgf/cm as a result. When repeating thermal shocks of −40° C. and thermal shocks of 125° C. 200 times, an average was 6.28 kgf/cm, thereby the joint strength was similar with the joint strength of room temperature.

The joint strength of the ceramic substrate according to the present disclosure performed at room temperature and even performed when applying the thermal shock of −40° C. and the thermal shock of 125° C. were much higher than 4 kgf/cm, which is a joint strength standard of a ceramic substrate.

The present disclosure provides a structure formed to unify the metal foil 40 and the ceramic base 10 through brazing instead of existing sintering processes by interfacial bonding forces, thereby greatly improving an adhesion between the metal foil 40 and the ceramic base 10.

The present disclosure reduces manufacturing costs greatly due to not requiring high temperature and vacuum sintering equipment and is capable of being manufactured without a high temperature and sintering process.

Although a specific embodiment of the present disclosure has been described for illustrative purposes, those skilled in the art will appreciate that various modifications, additions and substitutions are possible, without departing from the scope and spirit of the disclosure as disclosed in the appended claims.

The invention claimed is:

1. A method of manufacturing a ceramic substrate, the method comprising:
   preparing a ceramic base and a metal foil;
   forming a seed layer on the ceramic base;
   forming a brazing filler layer on the seed layer; and
   laminating the metal foil on the brazing filler layer and brazing; and
   wherein the brazing filler layer brazes the metal foil on the seed layer through a brazing layer formed by melting the brazing filler layer,
   wherein the forming of the brazing filler layer comprises laminating a brazing sheet on the seed layer, the brazing sheet having a laminated structure including a Ag layer and a Cu layer,
      a plurality of empty spaces being defined in the brazing filler layer, the empty spaces being spaced apart from one another,
   wherein the forming the seed layer comprises:
      forming a first seed layer on the ceramic base to ensure a strong bonding force with the ceramic base by deposition; and
      forming a second seed layer on the first seed layer to ensure a strong bonding force with the brazing filler layer by deposition,
   wherein the first seed layer is formed by one material selected from the group consisting of Ti, Hf, and Zr, and the second seed layer is formed by Ag or Cu.

2. The method of claim 1, wherein preparing the ceramic base and the metal foil includes a process of modifying a surface of the ceramic base roughly through chemical or physical treatments.

3. The method of claim 1, wherein preparing the metal foil includes preparing the metal foil by cutting or pressing the metal foil to have a shape of a circuit pattern formed thereon.

4. The method of claim 1, wherein forming the brazing filler layer includes forming the brazing filler plated layer having a thickness greater than 0 and equal to or less than 10 μm.

5. The method of claim 1, wherein the brazing filler layer includes a first Ag layer, one selected from the group consisting of an Al layer, an Ni layer, an Sn layer, and an In layer, laminated on the first Ag layer, and a second Ag layer laminated on a Cu layer, or the brazing filler layer includes a first layer selected from the group consisting of an Al layer, an Ni layer, an Sn layer, and an In layer, an Ag layer laminated on the first layer, and a second layer selected from the group consisting of an Al layer, an Ni layer, an Sn layer, and an In layer, laminated on the Ag layer.

6. The method of claim 1, wherein brazing comprises pressurizing the brazing filler layer interposed between the metal foil and the ceramic base while heating the brazing filler layer to a temperature of 900° C. or less.

7. The method of claim 1, wherein:
   the brazing filler layer includes a first Ag layer, another layer selected from the group consisting of an Al layer, a Ni layer, a Sn layer, and an In layer, the another layer laminated on the first Ag layer, and a second Ag layer laminated on a Cu layer; or
   the brazing filler layer includes a first layer selected from the group consisting of an Al layer, a Ni layer, a Sn layer, and an In layer, a Ag layer laminated on the first layer, and a second layer selected from the group consisting of an Al layer, a Ni layer, a Sn layer, and an In layer, the second layer laminated on the Ag layer.

8. The method of claim 1, wherein the brazing filler layer is formed to have multiple holes.

* * * * *